US006685073B1

(12) United States Patent
McKenna et al.

(10) Patent No.: US 6,685,073 B1
(45) Date of Patent: Feb. 3, 2004

(54) METHOD AND APPARATUS FOR STRETCHING AND PROCESSING SAW FILM TAPE AFTER BREAKING A PARTIALLY SAWN WAFER

(75) Inventors: Robert G. McKenna, Houston, TX (US); David Durin, Rowlett, TX (US); Don Brown, Bedford, TX (US); Cecil Davis, Greenville, TX (US); John Jones, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 08/975,029

(22) Filed: Nov. 20, 1997

Related U.S. Application Data

(60) Provisional application No. 60/032,039, filed on Nov. 26, 1996.

(51) Int. Cl.[7] ............................................. H01L 21/461
(52) U.S. Cl. ........................ 225/2; 225/95.5; 438/464; 83/171
(58) Field of Search ..................... 83/18, 100, 167, 83/171, 175, 610; 225/1, 2, 94, 96.5, 103, 104, 105; 451/41; 125/13, 16.01, 16.02; 29/413; 438/464

(56) References Cited

U.S. PATENT DOCUMENTS

| 1,179,482 A | * | 4/1916 | Weber .......................... 83/167 |
| 2,647,578 A | * | 8/1953 | Connor et al. ................. 83/175 |
| 3,493,155 A | * | 2/1970 | Litant et al. .................... 225/2 |
| 3,507,426 A | * | 4/1970 | Bielen et al. ................... 225/2 |
| 3,562,057 A | | 2/1971 | McAlister et al. |
| 3,562,058 A | | 2/1971 | Boyd |
| 3,565,306 A | | 2/1971 | Louis |
| 3,677,875 A | | 7/1972 | Althouse |
| 3,678,550 A | * | 7/1972 | Zuhlke et al. ................. 225/96 |
| 3,790,051 A | | 2/1974 | Moore |
| 4,140,260 A | * | 2/1979 | Gantley ....................... 225/103 |
| 4,296,542 A | | 10/1981 | Gotman |
| 4,706,370 A | * | 11/1987 | Blattner et al. ................ 83/167 |
| 4,775,085 A | | 10/1988 | Ishizuka et al. |
| 5,104,023 A | * | 4/1992 | Nishiguchi et al. ......... 225/96.5 |
| 5,227,001 A | | 7/1993 | Tamaki et al. |
| 5,710,065 A | * | 1/1998 | Alfaro ......................... 437/226 |

FOREIGN PATENT DOCUMENTS

| EP | 0 289 045 A2 | | 11/1988 | |
| SU | 1278-068 A | * | 12/1986 | ..................... 83/18 |

* cited by examiner

Primary Examiner—Kenneth E. Peterson
(74) Attorney, Agent, or Firm—Wade James Brady, III; Frederick J. Telecky, Jr.

(57) ABSTRACT

A method and apparatus for separating a wafer into wafer portions comprising a larger wafer flex-frame (50) supported on a support base (40) and a smaller flex-frame (60) positioned within the support base (40). A wafer film transfer cylinder (30) encompasses a wafer breaking device (12), such as a convex dome. The transfer cylinder (30) is slidable downwardly with respect to the dome (12) to first stretch the wafer tape (51) and then transfer the wafer (56) from the larger frame (50) to the smaller frame (60) after dome (12) breaks the wafer (56) into die. The transfer cylinder (30) is heated to facilitate removing the saw tape (51) from the larger frame (50) after transfer to the smaller frame (60). The transfer cylinder (30) is juxtaposed with the smaller frame (60) residing within a cavity (48) of the support base (46). The present invention is suited for automated wafer transfer carriers which advance the broken wafer to pick and place equipment for packaging of the die.

18 Claims, 2 Drawing Sheets

METHOD AND APPARATUS FOR STRETCHING AND PROCESSING SAW FILM TAPE AFTER BREAKING A PARTIALLY SAWN WAFER

CROSS REFERENCE TO RELATED APPLICATIONS

This application claims priority under 35 U.S.C. §119(e)(1) of provisional application No. 60/032,039, filed Nov. 26, 1996.

Cross reference is made to the following co-pending patent applications.

| SERIAL NO. | TITLE | FILED |
| --- | --- | --- |
| 08/367,970 | METHOD AND APPARATUS FOR BREAKING AND SEPARATING DIES FROM A WAFER | Jan. 3, 1995 |
| 08/485,168 | METHOD AND APPARATUS FOR BREAKING AND SEPARATING DIES FROM A WAFER | June 7, 1995 |
| TI-23376 (Attorney's Docket #) | UV EXPOSURE OF STRETCHED UV-TAPE ON WAFER FRAMES TO ELIMINATE PREMATURE TAPE DELAMINATION FROM THE FRAME | HEREWITH |
| TI-22810 (Attorney's Docket #) | METHOD AND APPARATUS FOR BREAKING AND SEPARATING DIE FROM A WAFER USING A MULTI-RADII DOME | HEREWITH |

TECHNICAL FIELD OF THE INVENTION

The present invention is generally related to processing semiconductor wafers, and more particularly to a method and apparatus for breaking a processed wafer into individual die and transferring the wafer to a wafer carrier for pick and place equipment that packages the die.

BACKGROUND OF THE INVENTION

In the manufacture of semiconductor devices, it is conventional to form many integrated circuits or devices upon a single wafer of semiconductor material, such as silicon. After the devices have been formed on the wafer, it is necessary to separate each device from one another such as by completely cutting the wafer into segments on which one or more devices or circuits have been formed, these segments commonly being referred to as die. For devices that are unsuitable for a complete saw process due to handling constraints, such as micromechanical devices including the Digital Micromirror Device (DMD) manufactured by Texas Instruments of Dallas, Tex., the separation of the individual die may also be undertaken by a wafer break process. Orthogonal lines may be scribed on the wafer, or a partial saw can be performed on the wafer streets extending between devices, the saw lines commonly being known as kerfs. The wafer is then broken along these wafer kerfs to form individual die. If care is not taken during the breaking of the wafer, the individual die may be partially fractured or broken.

During the wafer break process, the fabricated wafer may be placed upon a stretchable membrane such as a wafer tape having an adhesive on one side. As the wafer is broken, the tape is stretched to further separate the formed die from one another to avoid the die corners from rubbing against one another. After the wafer break process, pick and place equipment removes the individual die from the tape. These die are then packaged with leads and pins, the packaging comprising plastic, ceramic or other suitable material. Sometimes, the die are hermetically sealed in the package to prevent moisture from damaging the device, particularly if the device is a micromechanical device having moving parts.

The breaking of the wafer into die can be performed using any of several conventional methods. In one process, a roller is rolled across the back side of the inverted partially sawn semiconductor wafer. Using another method, the wafer can be supported upon an adhesive saw tape, inverted, and flexed outwardly with a hemispherical dome. Such techniques are shown in commonly assigned U.S. Pat. No. 3,562,057 to McAlister, et al, and also in U.S. Pat. No. 5,104,023 to Nishiguchi, et al. In these two patents, the semiconductor wafer is supported upon a flexible tape membrane, inverted, and pressed downwardly by a spherical dome.

In the commonly assigned patent application Ser. No. 08/367,970 entitled "Method and Apparatus for Breaking and Separating Dies from A Wafer", and also in commonly assigned patent application Ser. No. 08/485,168, entitled "Method and Apparatus for Breaking and Separating Dies from A Wafer", there is disclosed a method and apparatus for separating a wafer and the handling of the wafer tape after the break process.

It is desired to provide an improved method and apparatus for breaking a semiconductor wafer into die, and a method for expanding the saw film during and after the wafer break process. It is especially desired to provide an improved and simpler method for breaking and handling wafers comprised of micromechanical circuits, such as the DMD, to minimize the generation of particles and prevent the mechanical rubbing of die after the break process. It is further desired to provide an improved method and apparatus for transferring the wafer tape and die to a wafer carrier which is suited for automated pick and place die removing equipment which facilitates the die packaging process.

SUMMARY OF THE INVENTION

The present achieves technical advantages as a method and apparatus including a large flex-frame supporting a wafer saw film tape and wafer during the wafer saw and break process, whereby a transfer cylinder encompasses a break dome to stretch the saw film as it pushes the wafer film off the breaking dome and transfers the wafer film to a smaller second frame. This second smaller frame receives the sticky surface of the wafer tape, and is juxtaposed with the sliding transfer cylinder. The rim of the transfer cylinder encompassing the break dome forces the sticky surface of the saw film into contact with the smaller second flex-frame with sufficient pressure to cause the tape to sufficiently adhere to the smaller flex frame. A resistance heating wire is positioned around the outer periphery of the transfer cylinder rim. This wire is heated, causing the saw film to melt such that the saw film easily separates from the large flex-frame following transfer. The small second flex-frame holding the saw film and broken wafer is then transferred to a carrier, this carrier being suited to automated processing equipment which ultimately packages the die. A support base supports the large flex-frame and has upwardly extending walls defining a cavity, with the smaller second flex-frame residing within this cavity. The transfer cylinder pushes the stretched saw film tape and broken wafer downwardly into the cavity until the stretched saw film tape is supported by the smaller flex-frame.

DETAIL DESCRIPTION OF THE PREFERRED EMBODIMENT

Figure 1:
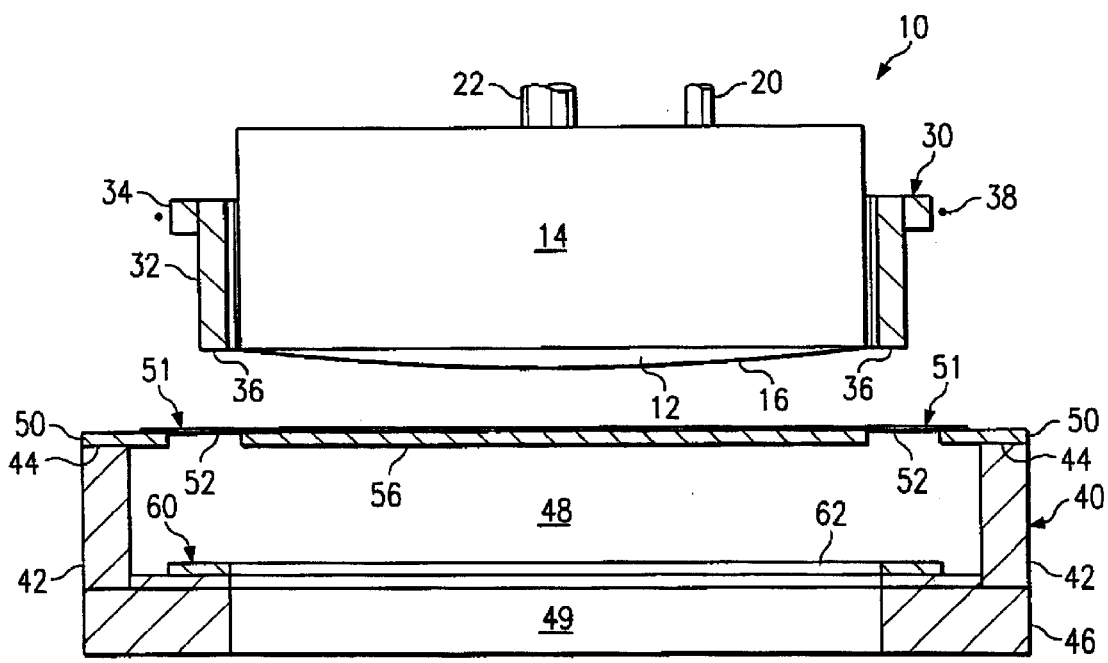
FIG. 1 is a side view of a wafer break apparatus according to the preferred embodiment of the present invention, comprising a larger first frame supporting a saw film tape and unbroken wafer across a support base cavity, the apparatus including a sliding transfer/expansion cylinder encompassing a break dome and being supported over and juxtaposed with a smaller flex-frame.

Referring now to FIG. 1, there is generally shown at 10 a wafer breaking apparatus according to the preferred embodiment of the present invention. Apparatus 10 is seen to include a wafer break device preferably being a dome 12 secured to the underside of a piston 14, the dome 12 having a domed convex surface 16. Piston 14 has a vacuum chamber defined therewithin (not shown), this vacuum chamber being in communication with a vacuum feed line 20. The breaking dome 12 has a plurality of equally spaced openings (not shown) extending through the surface 16 thereof, these openings extending into the vacuum chamber of piston 14 to allow a vacuum to be maintained against the backside of the wafer tape during the wafer break process. A piston member 22 is attached to piston 14 for advancing and retracting the piston 14 and dome 12 in the vertical direction as will be discussed shortly. It is to be recognized that other wafer break devices i.e. rollers could be utilized if desired, and limitation to an anvil is not to be inferred.

Apparatus 10 is also seen to include a saw film transfer/expander cylinder 30 completely encompassing the side of piston 14 and the wafer break dome 12. Transfer cylinder 30 is geometrically uniform and preferably cylindrical comprising a vertically extending sidewall 32, a flanged shoulder 34 and a rim face 36. Transfer cylinder 30 is slidable in the vertical direction with respect to the breaking dome 12 and the rest of apparatus 10.

Still referring to FIG. 1, there is generally shown at 40 a first large wafer flex-frame, preferably comprised of flexible stainless steel. Flex-frame 50 is mounted on and supported by a support base 40 having an upwardly extending cylindrical wall 42, a wall rim 44 and an annular base 46. The cylindrical walls 42 and annular base 46 define a cavity 48 therewithin which is accessible through a base opening 49. The rim 44 has a diameter equivalent with flex-frame 50. Rim 44 supports first flex-frame 50, which frame 50 is seen to support taut across cavity 48 a flexible saw frame tape 51 having an adhesive side 52 facing downwardly. A completely fabricated and partially sawn wafer 56 having defined thereon a plurality of integrated circuits is seen to be attached to the adhesive or sticky side 52 of film 51. The wafer 56 is inverted with the devices facing downwardly and into the cavity 48. The large flex-frame 50 is generally cylindrical and has a diameter of about 8 inches for a 6 inch wafer in the shown embodiment, and may be 10.5 inches in diameter for an 8 inch wafer but no limitation is intended for scope of the present invention. The flex-frame 50 has a diameter substantially larger than the diameter of the wafer to allow stretching of the tape 51 about the wafer. Flex-frame 50 and the periphery of tape 51 is clamped to the support base 40 with a clamp (not shown) to prevent separation of the tape from frame 50 as it is stretched, as will be described shortly.

Securely residing within the cylindrical wall 42 is a smaller flex-frame generally shown at 60. Flex-frame 60 is annular shaped and has a smaller diameter than the first flex-frame 50. The inner diameter of frame 60 is about 7.70 inches, and is generally the same as but slightly larger than the diameter of wafer 56. The second smaller flex-frame 60 securely rests upon the base 46 and defines a thin frame opening 62 which ultimately receives the broken wafer 56 as will be discussed shortly. The opening 62 has a diameter equal to and aligned with opening 49 extending through base 46. The second flex-frame 60 securely rests upon, and is removable from, the base 46 after transfer of the wafer tape and broken wafer thereto for transfer to a wafer carrier.

Figure 2:
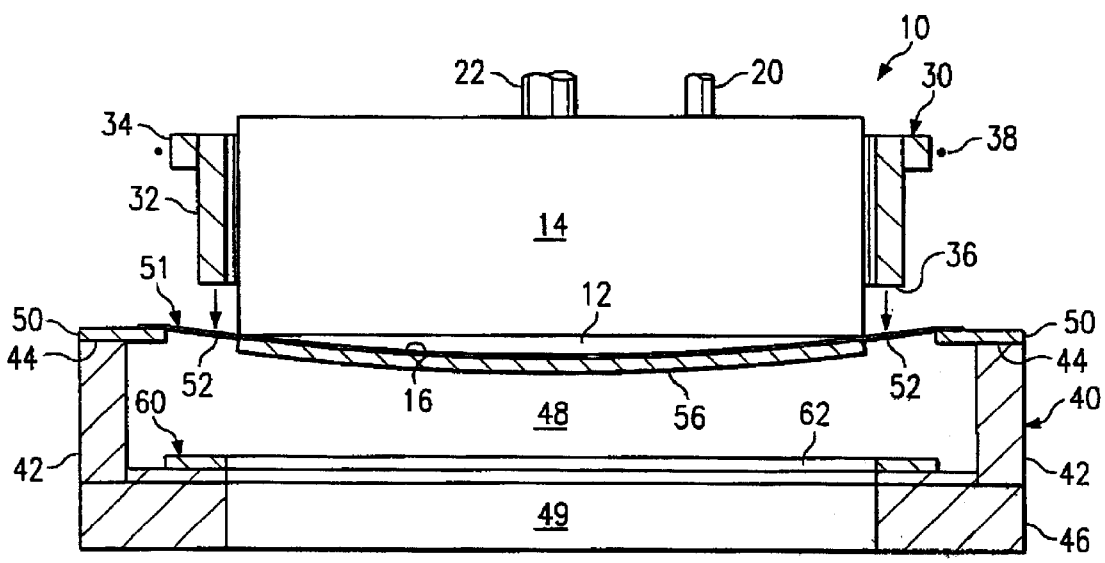
FIG. 2 illustrates the first step of the wafer break process whereby the breaking dome advances downwardly and engages the saw film tape proximate the back side of a partially sawn fabricated wafer to break the wafer into individual die.

Referring now to FIG. 2, there is shown the first step for implementing apparatus 10 according to the preferred method of the present invention. As shown, the convexed surface 16 of wafer break dome 12 is brought downwardly by piston 14 to engage the wafer saw film 51 proximate the backside of the fabricated wafer 56. The X-Y axis of the dome are precisely aligned with the X-Y axis of wafer 56 to ensure an even force is provided to the center of wafer 56. The wafer breaks along the scribe lines or saw kerfs formed in the fabricated wafer 56 between the completed integrated circuits, to form the die and the sawn film tape 51 stretches. As the tape 51 is stretched by the wafer break dome 12, the formed die supported thereon further separate from one another to prevent the corners of the die from rubbing against one another. The cavity 48 is filled with ionized air during the break process through openings 62 and 49 to neutralize electrostatic charges induced as the tape 51 is stretched across the tape frame 50. Openings 62 and 49 also permit particles generated during wafer break to be exhausted from cavity 48.

Figure 3:
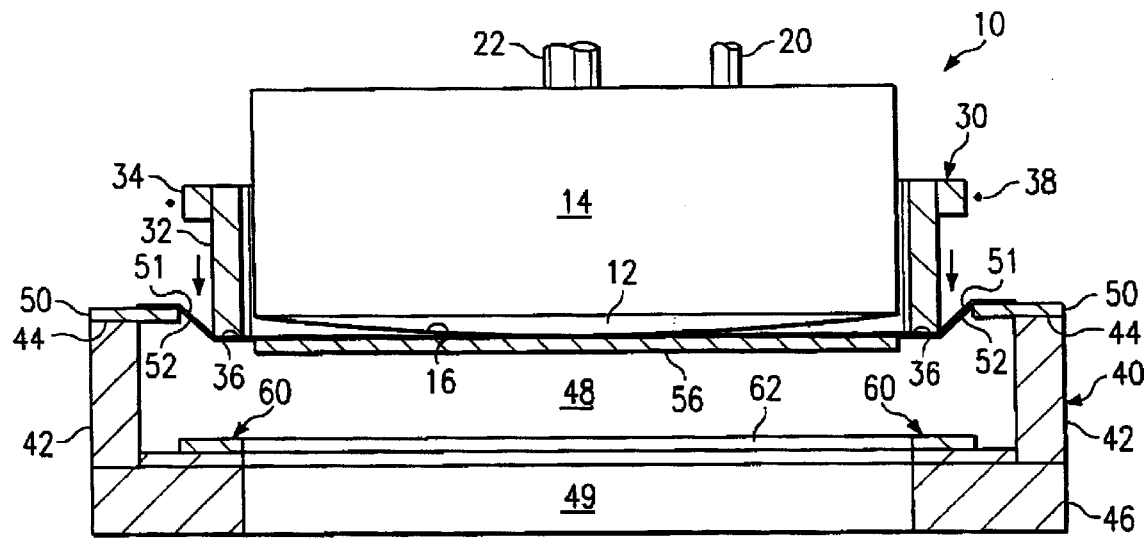
FIG. 3 illustrates the transfer/expansion cylinder encompassing the wafer breaking dome being lowered to engage and stretch the saw film tape while removing the saw film tape and broken wafer from the breaking dome.

Referring to FIG. 3, the encompassing transfer cylinder 30 is seen to be extended downwardly about the wafer break dome 12 such that rim 36 engages the stretched saw film tape 51 closely proximate the broken wafer 56. As the transfer frame 30 is extended downwardly, the frame pushes the wafer tape 51 and broken wafer 56 off the surface 16 of the breaking dome 12, while stretching the tape 51 to cause the individual die to be further separated from one another. The frame 50 and saw film tape 51 remain clamped to base member 40. The rim 36 of the cylinder 30 advances downward and forces the sticky surface 52 of the saw film 51 into secure contact with the juxtaposed smaller flex-frame 60. The wall 42 of support member 40 has a height of about 0.5 inches such that the tape stretches about 10–15%. However, the height is commensurate with the tape used as specified by the tape manufacturer so that the tape does not tear, and this height can vary. It is noted that the scaling of base member 40 in FIGS. 1–4 is exaggerated in the vertical direction to illustrate the operation of the present invention.

This expander transfer cylinder 30 includes a means for selectively heating the cylinder, such as a resistance heating wire 38, to heat the outer edge of the cylinder rim 36 of the cylindrical walls 32 where it engages the stretched portions of the film 51. The periphery of the saw tape 51 is then heated with the outside edge of cylinder rim 36 proximate frame rim 60, and the saw film 51 engaging the edge of the cylinder rim 36 melts, causing it to completely separate from the larger flex-frame 50 while remaining adhered to smaller frame rim 60. The transfer cylinder 30 is than retracted.

Figure 4:
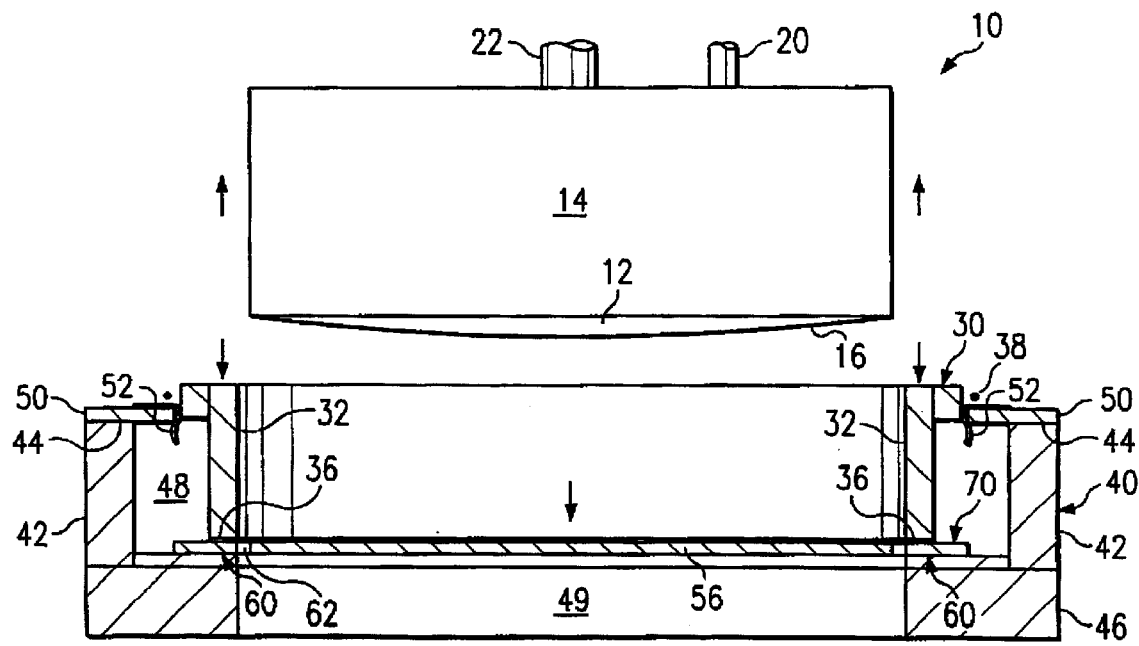
FIG. 4 illustrates the transfer/expansion cylinder transferring the stretched saw film tape and broken wafer to the juxtaposed small flex-frame positioned within the larger flex-frame whereby the sticky side of the adhesive saw film tape is compressed onto the smaller flex-frame, this smaller flex-frame holding the broken wafer then being transferred to a wafer carrier for subsequent packaging of the individual die.

After the wafer film 51 is free of the dome surface 16 and flex-frame 50, the die are adequately separated for subsequent die removal equipment. As shown in FIG. 4, the saw film stretch and transfer operation is now complete. The small flex-frame 60, with the stretched saw film 51 holding the broken wafer 56, is rotated upright with the die facing upwardly and transferred to a wafer carrier. This wafer carrier is transferred using automated equipment to pick and place equipment. The die are removed from the film 51 via opening 62 of frame 60, and packaged. The large flex-frame 50 is recycled and can be used to hold another wafer to be broken.

According to the present invention, a wafer can be broken while supported by a larger flex-frame 50, that is, a frame having a diameter substantially larger than the wafer to facilitate tape stretching, and then transferred to a smaller flex-frame that is commensurate with the diameter of the wafer, such as the second flex-frame 60. Moreover, the wafer tape is further stretched during and after the wafer break process, and is maintained in the stretched form as it is transferred to and adhered to the smaller flex-frame 60. The adequate spacing of the die is critical for pick and place equipment that grasps the die from the sides, without contacting the active surface of the die as is required of micromechanical devices and the like.

The present invention is particularly well suited for the handling of wafers having a plurality of micromechanical devices formed thereon, such as the digital micromirror device (DMD) which is susceptible to particles generated during the wafer break process. It is noted that the wafer 56 is maintained in the inverted position with the micromechanical devices facing downwardly during the wafer break process and transfer process, thus reducing the possibility of any generated particles damaging the individual die during or after the die breaking and separation process.

For purposes of the present invention, the domed surface 16 of breaking dome 12 has a generally convex shaped, and can have a spherical surface, but may also have other shapes as well such as a multi-radii surface having different radius of curvature in the X and Y direction, as disclosed in commonly assigned patent application Ser. No. 08/975,378 entitled "Method and Apparatus for Breaking and Separating Die from a Wafer Using a Multi-Radii Dome", the teachings of which are incorporated herein by reference. While a break dome is shown in the preferred embodiment as the wafer breaking device, other devices, such as rollers and the like, can be utilized to break the wafer into die, and these alternatives for breaking the wafer are intended to be encompassed by the present invention. The transfer frame 30 encompasses the wafer breaking device, and stretches while removing the tape from the first frame to transfer the tape and wafer to the second smaller frame in a simple method which can be easily automated. The larger flex-frame can be recycled and used to hold subsequent wafers during subsequent wafer breaking processes.

Though the invention has been described with respect to a specific preferred embodiment, many variations and modifications will become apparent to those skilled in the art upon reading the present application. It is therefore the intention that the appended claims be interpreted as broadly as possible in view of the prior art to include all such variations and modifications. For instance, other equivalent transfer members or frames could be utilized in place of the transfer cylinder to stretch and transfer the tape.

We claim:

1. A method of separating a wafer into wafer portions, said method comprising the steps of:
   b) providing a stretchable membrane;
   (b) attaching a first frame member to said stretchable membrane;
   (c) placing said wafer on a first side of said stretchable membrane;
   (d) disposing a second frame member on said first side of said stretchable membrane, said second frame member spaced apart from said stretchable membrane and said first frame member by a cavity region;
   (e) deforming said wafer and stretchable membrane while said wafer is attached to said stretchable membrane with a wafer breaking device by pressing said wafer into said cavity region to physically separate said wafer into said wafer portions; and
   (f) pressing a transfer member about said wafer breaking device and against said stretchable membrane to engage said stretchable membrane about said broken wafer and to press said first side of said stretchable membrane to against said second frame sever said stretchable membrane.

2. The method as specified in claim 1 wherein said transfer member comprises a cylinder, further comprising the step of sliding said cylinder about said wafer breaking device toward said second frame member to engage said stretchable membrane about said broken wafer.

3. The method as specified in claim 1, wherein said transfer member diameter is smaller than said first frame member diameter, further comprising the step of stretching said stretchable membrane with said transfer member to further separate said wafer portions.

4. The method as specified in claim 1 wherein said first side of said stretchable membrane is an adhesive side, said adhesive side adhesively engaging said second frame.

5. The method of claim 1 further comprising the step of using an anvil having a convex dome surface as said wafer breaking device.

6. The method as specified in claim 5 further comprising the step of using said anvil having a multi-radii said dome-surface.

7. The method as specified in claim 1 further comprising the step of using an upwardly extending support base to support said first frame member, said support base defining said cavity, said cavity receiving said transfer member in step (f).

8. An apparatus for separating a wafer into a plurality of wafer portions, comprising:
   a) a first frame member supporting a stretchable membrane having a wafer positioned thereon;
   b) a second frame member for engaging said stretchable membrane, said second frame member spaced apart from said first frame member by a cavity region;
   c) a wafer breaking device positioned over said first frame for engaging and stretching said stretchable membrane proximate said wafer and breaking said wafer; and
   d) a transfer member having a member diameter disposed about said wafer breaking device and moveable with respect thereto for engaging said stretchable membrane after said wafer breaking device breaks said wafer, and to press said first side of said stretchable membrane against said second frame.

9. The apparatus of claim 8 further comprising sliding means for sliding said transfer member with respect to said wafer breaking device to extend said membrane from said first frame member to said second frame member.

10. The apparatus as specified in claim 8, said said severing means comprises a resistance heating wire positioned around said transfer member.

11. The apparatus as specified in claim 8, said wafer breaking device operable to stretch said stretchable membrane by pressing said stretchable membrane and said wafer into said cavity region.

12. The apparatus as specified in claim 8 wherein said transfer member stretches said stretchable membrane as said membrane is engaged by said transfer member.

13. The apparatus as specified in claim 8 wherein said first frame member diameter is larger than said transfer member diameter.

14. The apparatus as specified in claim 13 further comprising a support base having an upwardly extending wall supporting said first frame member and defining said cavity, said transfer member being extendable into said cavity to stretch said stretchable membrane.

15. The apparatus as specified in claim 14 wherein said second frame member is positioned in said cavity for receiving said stretchable membrane extended by said transfer member.

16. The apparatus as specified in claim 15 wherein said second frame member is juxtaposed to said transfer member.

17. The apparatus as specified in claim 15 wherein said second frame member is selectively removable from said support base.

18. The apparatus as specified in claim 8 wherein said transfer member comprises a cylinder and said wafer breaking device comprises an anvil.

* * * * *